United States Patent
Choi et al.

(10) Patent No.: US 6,211,706 B1
(45) Date of Patent: Apr. 3, 2001

(54) METHOD AND CIRCUIT FOR DRIVING POWER TRANSISTORS IN A HALF BRIDGE CONFIGURATION ALLOWING FOR EXCESSIVE NEGATIVE SWING OF THE OUTPUT NODE AND INTEGRATED CIRCUIT INCORPORATING THE CIRCUIT

(75) Inventors: Chongwook Chris Choi; David C. Tam, both of Redondo Beach, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 08/872,450

(22) Filed: Jun. 10, 1997

Related U.S. Application Data (63) Continuation of application No. 08/434,791, filed on May 4, 1995, now abandoned.

(51) Int. Cl.⁷ ..................................................... H03K 3/00
(52) U.S. Cl. ........................... 327/108; 327/382; 327/587
(58) Field of Search .................................... 327/309, 310, 327/530, 534, 587, 108, 382, 537, 546, 333, 545, 384, 385; 361/111; 363/17, 95, 98, 132; 326/80, 81

(56) References Cited

U.S. PATENT DOCUMENTS

| | | | |
|---|---|---|---|
| 4,066,918 | * | 1/1978 | Heuner et al. ........................ 327/318 |
| 4,928,053 | | 5/1990 | Sicard et al. .......................... 323/284 |
| 4,933,573 | * | 6/1990 | Takeda et al. ........................ 327/534 |
| 4,994,955 | * | 2/1991 | Schoofs et al. ......................... 363/95 |
| 5,027,181 | * | 6/1991 | Larik et al. ........................... 327/310 |
| 5,105,099 | * | 4/1992 | Routh et al. ............................ 363/56 |
| 5,202,590 | * | 4/1993 | Liepold et al. ....................... 327/312 |
| 5,394,365 | * | 2/1995 | Tsukikawa ............................ 327/534 |
| 5,408,150 | | 4/1995 | Wilcox ................................. 327/108 |
| 5,467,050 | * | 11/1995 | Clapp, III et al. .................... 327/309 |
| 5,502,412 | * | 3/1996 | Choi et al. ............................ 327/333 |

FOREIGN PATENT DOCUMENTS 9427370  11/1994  (WO) .

* cited by examiner

*Primary Examiner*—Kenneth B. Wells
(74) *Attorney, Agent, or Firm*—Ostrolenk, Faber, Gerb & Soffen, LLP (57) ABSTRACT

A method and circuit for driving power transistors arranged in series in a half bridge configuration allowing for excessive negative swing of an output node between the transistors in the half bridge configuration. The series transistors are connected between a first voltage source and a common potential. A second voltage reference source is also provided. A terminal is connected to a common point coupled to anodes of intrinsic diodes of driver circuits for the power transistors. The second voltage source is connected between the common potential and the terminal so as to shift the level of the common point such that the intrinsic diodes will not forward bias due to negative output node transients generated by diode forward recovery and stray inductances. The circuit of the invention can also be incorporated in an integrated circuit including a single chip, e.g., a silicon chip.

16 Claims, 7 Drawing Sheets

(PRIOR ART)

METHOD AND CIRCUIT FOR DRIVING POWER TRANSISTORS IN A HALF BRIDGE CONFIGURATION ALLOWING FOR EXCESSIVE NEGATIVE SWING OF THE OUTPUT NODE AND INTEGRATED CIRCUIT INCORPORATING THE CIRCUIT

RELATED APPLICATIONS

This is a continuation of application Ser. No. 08/434,791 filed on May 4, 1995, now abandoned.

BACKGROUND OF THE INVENTION

The present invention is directed to a method and circuit for driving power transistors in a half bridge configuration allowing for excessive negative swing of the output node. It is also directed to an integrated circuit incorporating the circuit, e.g., a circuit integrated on a single silicon chip.

In driver circuits for power transistors, for example, power MOSFETs driving power equipment, the power transistors often switch a large current. The large switching current, combined with forward recovery characteristics of diodes and stray inductance in the circuit, generates a negative spike at the output node of the half bridge. These spike signals can be destructive to the driver circuits and also create noise.

SUMMARY OF THE INVENTION

It is accordingly an object of the present invention to provide a method and circuit for driving power transistors in a half bridge configuration allowing for excessive negative swing of the output node.

It is furthermore an object of the present invention to provide such a circuit which can be integrated on a single chip.

The above and other objects of the invention are achieved by a method for driving power transistors in a half bridge configuration allowing for excessive negative swing of an output node between the transistors in the half bridge configuration comprising arranging first and second power transistors in series in a half bridge configuration with an output node between the transistors; connecting the series transistors between a first voltage source and a common potential; providing a second voltage reference source; providing a terminal connected to a common point coupled to anodes of intrinsic diodes of driver circuits for the power transistors; and connecting the second voltage source between the common potential and the terminal so as to shift the level of the common point such that the intrinsic diodes will not forward bias due to negative transients at the output node.

The above and other objects of the invention are also achieved by a circuit for driving power transistors arranged in series in a half bridge configuration allowing for excessive negative swing of an output node between the transistors in the half bridge configuration, the series transistors being adapted to be connected between a first voltage source and a common potential, the circuit comprising: driver circuits for each of the power transistors, a terminal connected to a common point coupled to anodes of intrinsic diodes of the driver circuits for the power transistors; and the terminal being adapted to be connected to a second voltage source provided between the common potential and the terminal so as to shift the level of the common point such that the intrinsic diodes will not forward bias due to negative transients at the output node.

The above and other objects of the invention are also achieved by a method of integrating on a single integrated circuit chip a circuit for driving power transistors in a half bridge configuration allowing for excessive negative swing of an output node between the transistors in the half bridge configuration comprising:

arranging first and second power transistors in series in a half bridge configuration with an output node between the transistors;

connecting the series transistors between a first voltage source and a common potential;

providing a second voltage reference source;

providing a terminal coupled to a common point coupled to anodes of intrinsic diodes of driver circuits for the power transistors; and connecting the second voltage source between said common potential and said terminal so as to shift the level of said common point such that said intrinsic diodes will not forward bias due to negative transients at the output node.

The above and other objects of the invention are also achieved by a circuit integrated on a single integrated circuit chip for driving power transistors arranged in series in a half bridge configuration allowing for excessive negative swing of an output node between the transistors in the half bridge configuration, the series transistors being adapted to be connected between a first voltage source and a common potential, the circuit comprising:

driver circuits for each of the power transistors;

a terminal connected to a common point coupled to anodes of intrinsic diodes of the driver circuits for the power transistors; and the terminal being adapted to be connected to a second voltage source provided between said common potential and said terminal so as to shift the level of said common point such that said intrinsic diodes will not forward bias due to negative transients at the output node.

Other features and advantages of the present invention will become apparent from the following description of the invention which refers to the accompanying drawings.

DETAILED DESCRIPTION OF EMBODIMENTS OF THE INVENTION

Figure 1A:
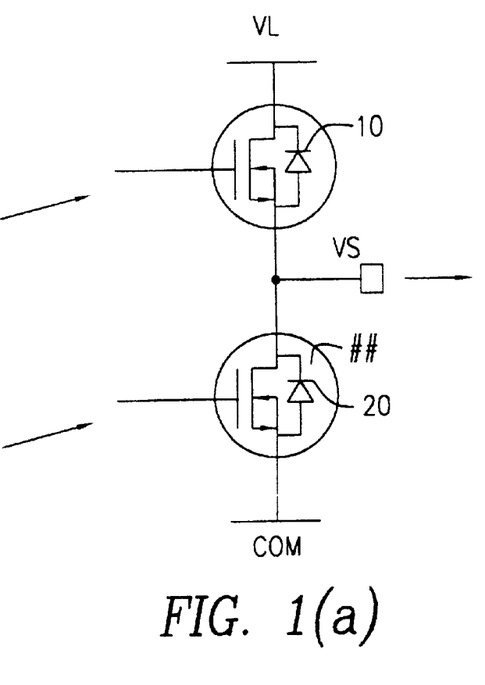
FIG. 1(a) shows power transistors, illustratively power MOSFET, arranged in a half bridge configuration.

With reference now to the drawings, FIG. 1(a) shows power transistors, in particular, power MOSFET, in a typical half bridge circuit. In the arrangement shown, two power transistors are configured in series in a totem pole arrangement. The high side transistor 10 has its drain connected to a voltage supply VL and the low side transistor 20 has its source connected to a common reference point. The output may be taken at the common node between the two transistors 10 and 20 and is coupled to the VS pin from the driver circuit coupled to the power transistors, and described in more detail with reference to FIG. 2.

Figure 1B:
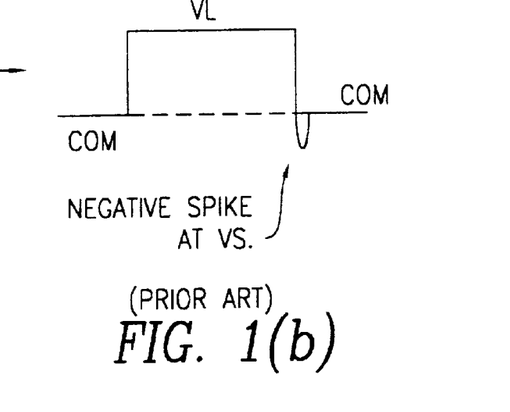
FIG. 1(b) shows a typical output pulse at the common output node of the power transistors, including a negative spike, as encountered in the prior art circuits.

In a half bridge circuit, the output node typically swings below ground (COM) as shown in FIG. 1(b). This negative spike is typically higher for high power circuits or highly inductive circuits and can reach tens of volts.

Figure 2:
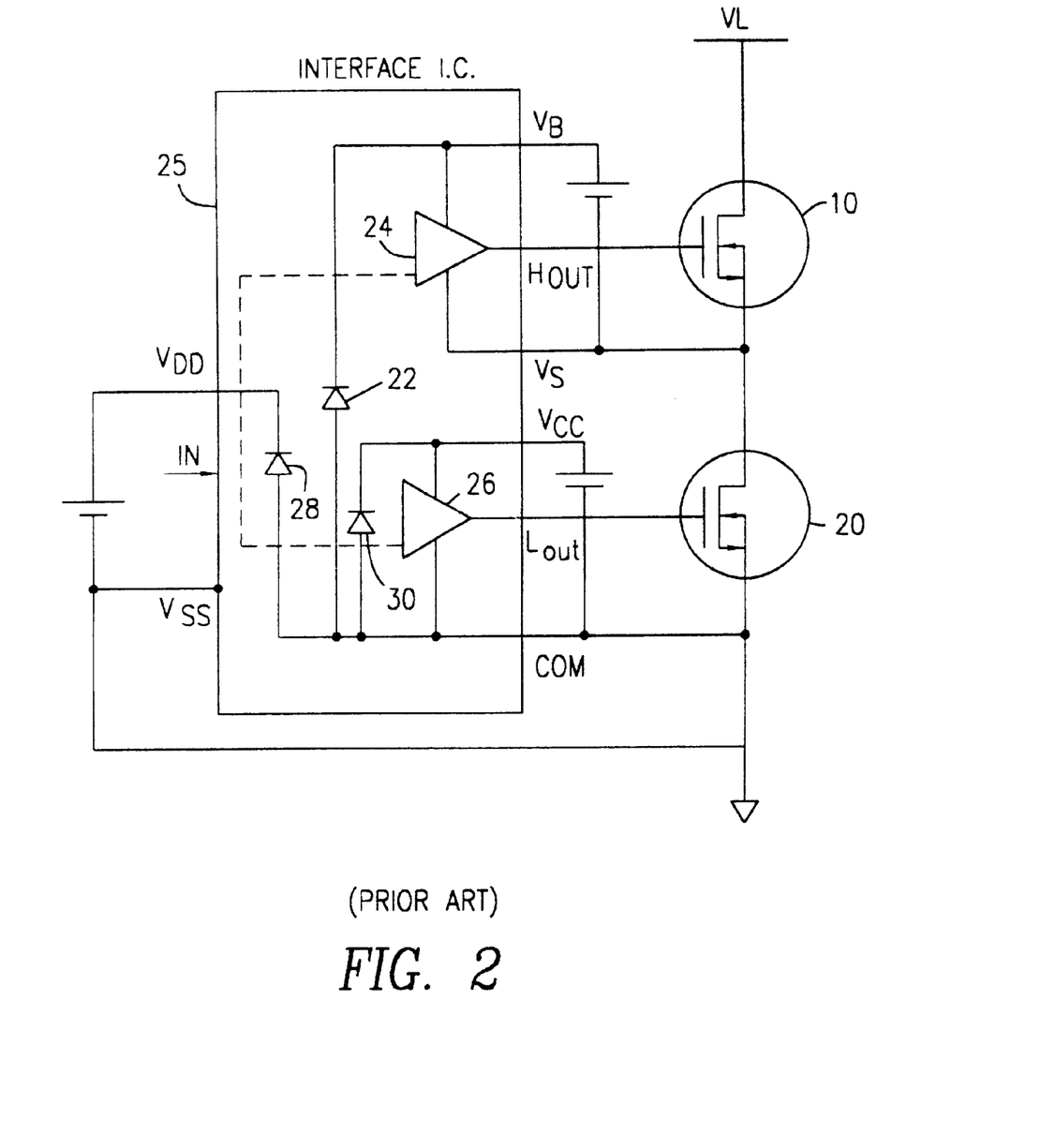
FIG. 2 shows a typical half bridge configuration interfaced with a driver interface IC which provides the driver signals to drive the power transistors.

With reference to FIG. 2, which shows the half bridge configuration being driven by an interface chip 25, for example, the IR 2110 available from International Rectifier Corp., in such a junction isolated integrated circuit 25, VS cannot fall below reference COM by more than the supply potential VB because the supply potential VB will also fall below COM and the inherent diode 22 between VB and COM will forward bias. This inherent or parasitic diode 22 is typically present in driver circuits of the type shown in FIG. 2. In some situations, the forward biasing of this diode can create significant currents which can damage the diode or other parts of the circuit. Therefore, it is preferable to prevent the parasitic diode 22 from forward biasing if possible, so as to prevent damage to the circuit. In addition to the parasitic diode 22, a parasitic diode 28 between VDD and COM and another parasitic diode 30 between VCC and COM are also present.

Figure 5:
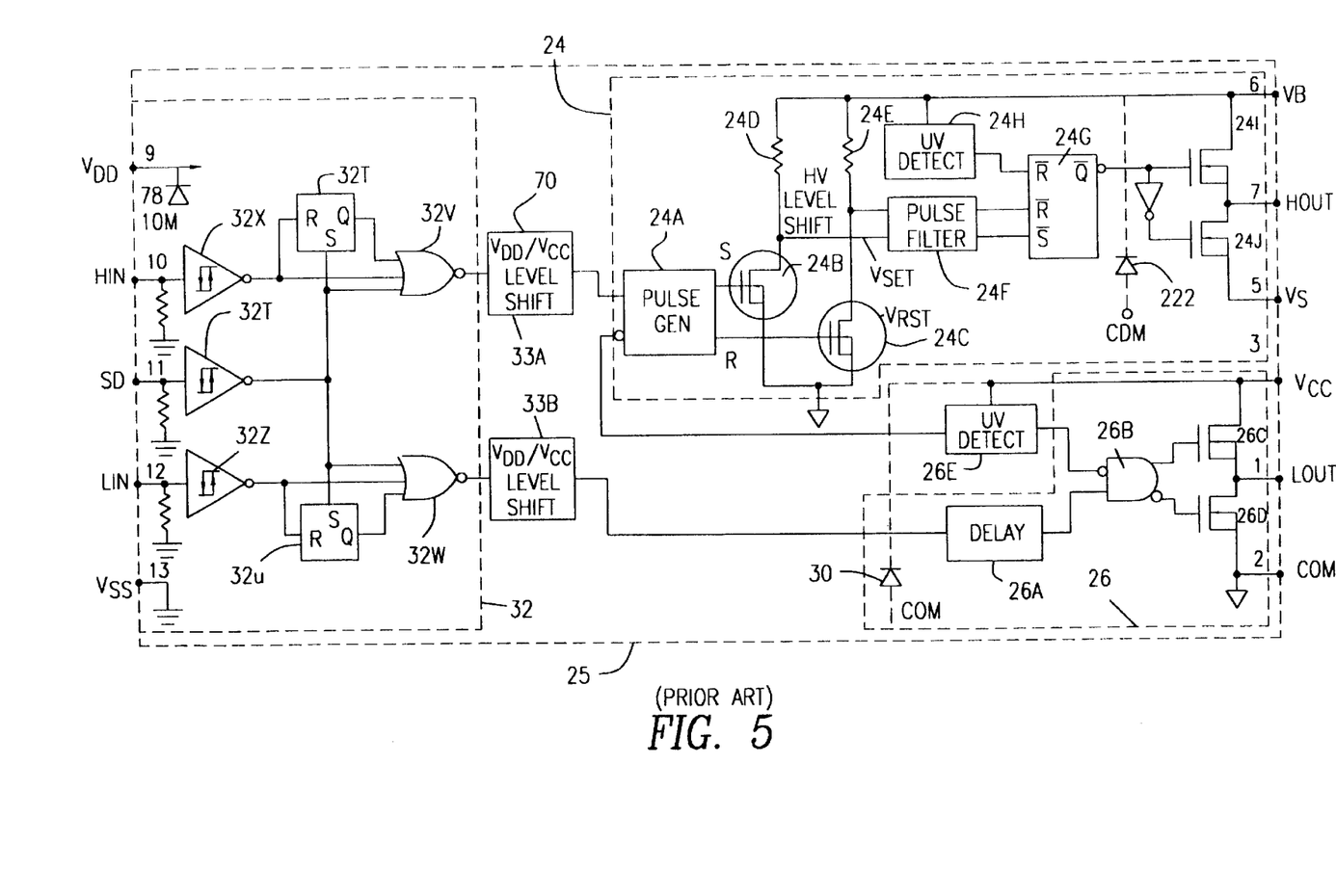
FIG. 5 shows a conventional integrated circuit driver which can be modified in accordance with the invention to incorporate the circuit of the invention.

FIG. 5 shows a conventional interface chip 25 in greater detail. In particular, FIG. 5 shows the details of a conventional IR-2110 integrated circuit driver device. This device can be modified in accordance with the invention to incorporate the circuit of the invention which is shown in detail in FIGS. 3(a) and 3(b).

FIG. 5 is a functional block diagram of the circuit contained within the integrated circuit 25 in FIG. 2. Logic input pins 10, 11 and 12 are connected through Schmitt triggers 32X, 32Y and 32Z to the RS latches 32T and 32U and to logic circuits 32V and 32W. The outputs of logic circuits 32V and 32W are coupled, respectively, to level shift circuits 33A and 33B. As will be seen, the outputs of the level shift circuits 33A and 33B control the high side control output and low side control output at pins 7 and 1, respectively.

The output from level shift circuit 33B in the low voltage channel is applied through a delay circuit 26A and one input of gate circuit 26B. The output of gate 26B is connected to the gate electrodes of driver output MOSFET transistors 26C and 26D. As will be later described, these transistors will produce a gate voltage at pin 1 (L OUT) when required by the logic input to pins 11 and 12.

The circuit of FIG. 5 also contains an under-voltage detection circuit 27 which disables the output from gate 26B when an under voltage is detected at pin 3 (VCC) to prevent turn-on of the power MOSFET or IGBT operated from pin 1.

The level shift circuit 33A for the high voltage channel of the circuit has one input connected to the pulse generator 24A. Under-voltage detection circuit 27 is also connected to pulse generator 24A and will turn off the high voltage output channel responsive to the detection of an under-voltage condition at pin 3 (VCC).

Pulse generator 24A has two outputs, a set(s) output connected to the gate of MOSFET 24B and a reset (R) output connected to the gate of MOSFET 24C.

The sources of MOSFETs 24B and 24C are connected to a common connection rail and their drains are connected to resistors 24D and 24E, respectively.

During normal operation, the application of pulses to MOSFETs 24B and 24C from the pulse generator 24A will produce output voltage pulses Vset and Vrst at the nodes between MOSFETs 24B and 24C and their respective resistors 24D and 24E.

The pulses Vset and Vrst are then applied to a pulse filter 24F. The output channels of filter 24F are connected to the R and S inputs of latch 24G. A second under-voltage detection circuit 24H is provided as an input to the latch 24G to ensure that no signal is applied at pin 7 if an under-voltage is detected at pin 6.

The output of the RS latch 24G is then used to turn driver MOSFETs 24I and 24J on and off. Thus, if a high signal is applied to input R of the RS latch 24G, the output at pin 7 is turned off. If a high signal is applied to the S input of latch 24G, the output at pin 7 will turn on.

FIG. 5 shows the intrinsic diode 22 present between VB and COM, shown also in FIG. 2. In addition, intrinsic diodes are also found between VDD and COM and between VCC and COM. See diodes 28 and 30 in FIG. 5.

Figure 3A:
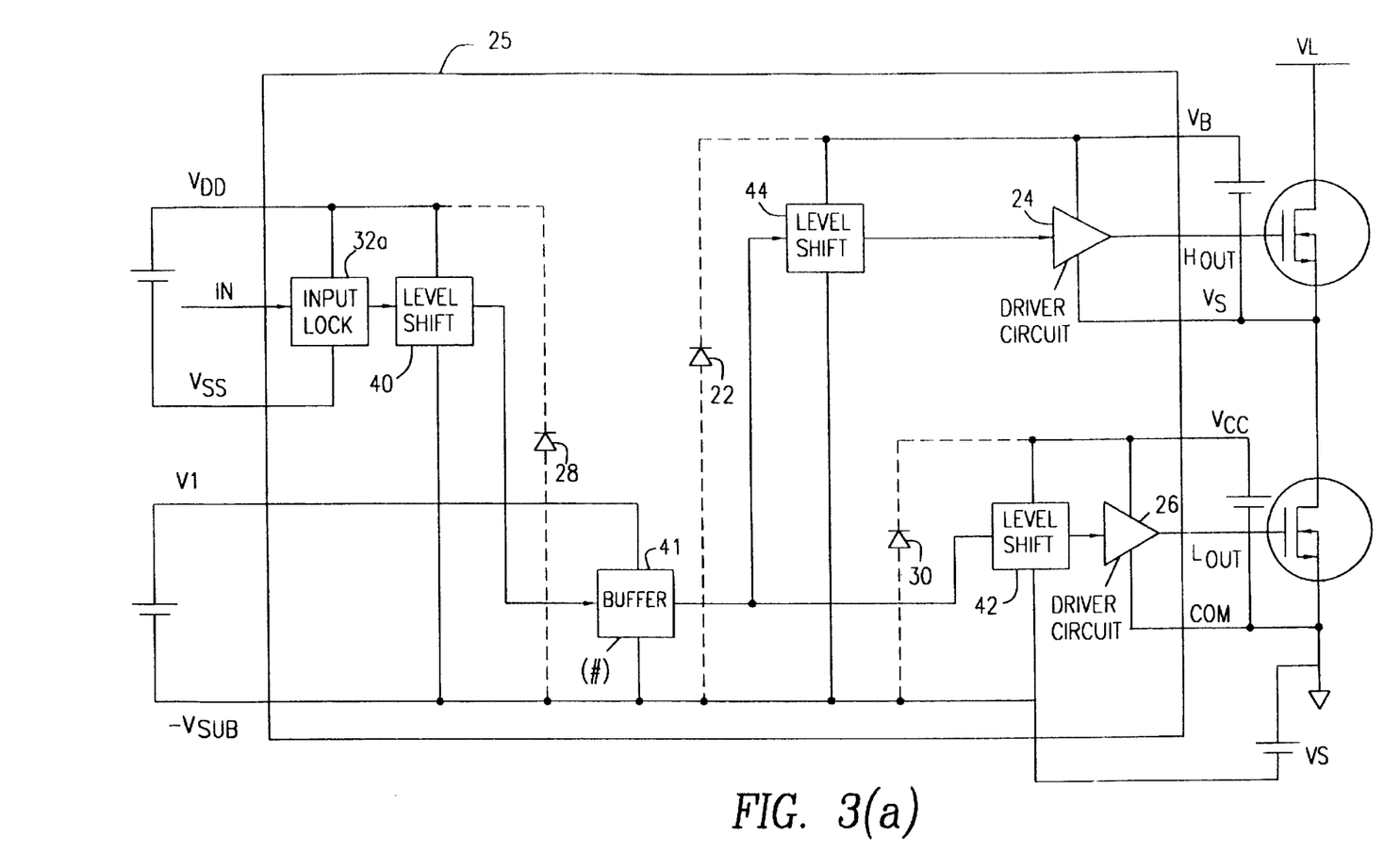
FIGS. 3(a) and 3(b) show two arrangements according to the invention which allow power transistors and the driver circuits to operate with negative output node spikes without damage.
Figure 3B:
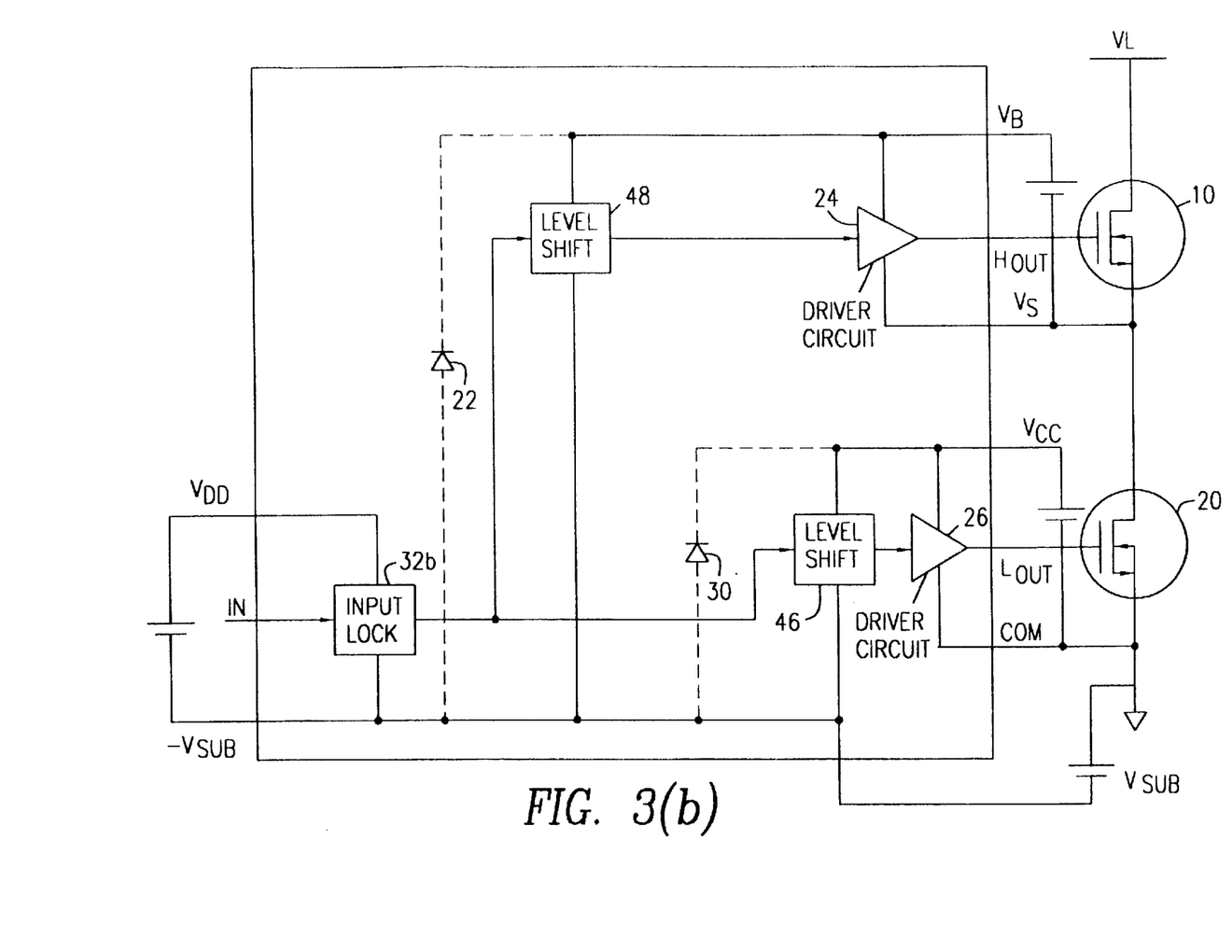

FIGS. 3(a) and 3(b) show two examples of how transistors in a half bridge configuration can be operated in a safe manner and allowing for excessive negative swing of the output node without damage to the driver circuits. These figures show how the circuit of FIG. 5 can be modified in accordance with the invention. The allowable negative spike at the output node between transistors 10 and 20 can be increased using either one of the two circuits shown in FIG. 3(a) or FIG. 3(b).

According to the invention, the common anodes of intrinsic diodes 22, 28 and 30, which are always present as shown in the drawing figures, are floated with respect to the reference COM of the low side driver circuit 26 by a voltage Vsub. As shown, the floating voltage supply Vsub is polarized such that the anodes of the intrinsic diodes 22, 28 and 30 are at a negative potential-Vsub with respect to COM. In this way, VS can fall below COM by a value up to the Vsub potential. This configuration allows for the custom setting of the allowable negative spike at the output node VS for a given application.

The two circuits of FIGS. 3(a) and 3(b) differ only by the fact that the input logic circuits 32a and 32b are referenced differently. In FIGS. 3(a) and 3(b), the details of the interface circuit 25, shown in FIG. 5, are not shown. In FIGS. 3(a) and 3(b), suitable level shifting circuits are necessary to supply the driver signals from input circuits 32a and 32b to the driver circuits 24 and 26. Such level shifting circuits can be of the type disclosed in U.S. Pat. No. 5,502,412, issued Mar. 26, 1996, filed concurrently herewith and the disclosure of which is incorporated by reference herein.

In FIG. 3(a), the input circuit 32a floats above the voltage −Vsub. Accordingly, in the circuit of FIG. 3(a), a level shifting circuit 40 will be necessary to shift the level of the output of input circuit 32a first to the −Vsub reference level. The output of the level shifting circuit 40 is coupled to a buffer 41, and the output of the buffer 41 is coupled to level shifting circuits 44 and 42. The level shifting circuit 42 is necessary to shift the level of the signals from the −Vsub level to the level COM to drive the low side driver circuit 26, and the level shifting circuit 44 is necessary to shift the level of the signals from the −Vsub level to the reference level VB to drive the high side driver circuit 24.

In FIG. 3(b), since the input circuit 32b is already referenced to the −Vsub level, only two level shifting circuits are necessary, one (46) to shift the level of the output of the input circuit 32b to the COM reference level for driving the low side driver circuit 26 and another (48) to shift the reference level to the reference level VB of the high side driver circuit 24.

Figure 4:
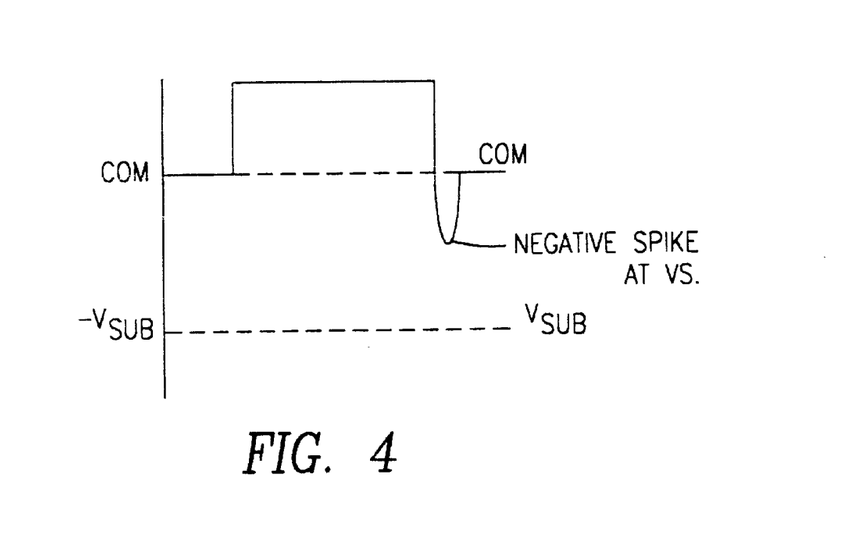
FIG. 4 shows an output pulse of the circuit of FIGS. 3(a) or 3(b), illustrating how the circuit of the invention prevents driver circuit intrinsic diode forward biasing, thereby allowing operation of the circuit without damage from negative output node spikes.

Because the anode of the intrinsic diode 22 is now at the level −Vsub with respect to the reference level COM in the circuits of FIGS. 3(a) and 3(b), this diode will not forward bias if VS falls below COM by up to the Vsub potential. This is shown graphically in FIG. 4, which shows the negative spike at the output note Vs above the −Vsub potential, thereby preventing intrinsic diode forward conduction. Accordingly, the high current conditions caused in the prior art circuit of FIG. 2 due to the forward biasing of the intrinsic diodes cannot occur.

Figure 6A:
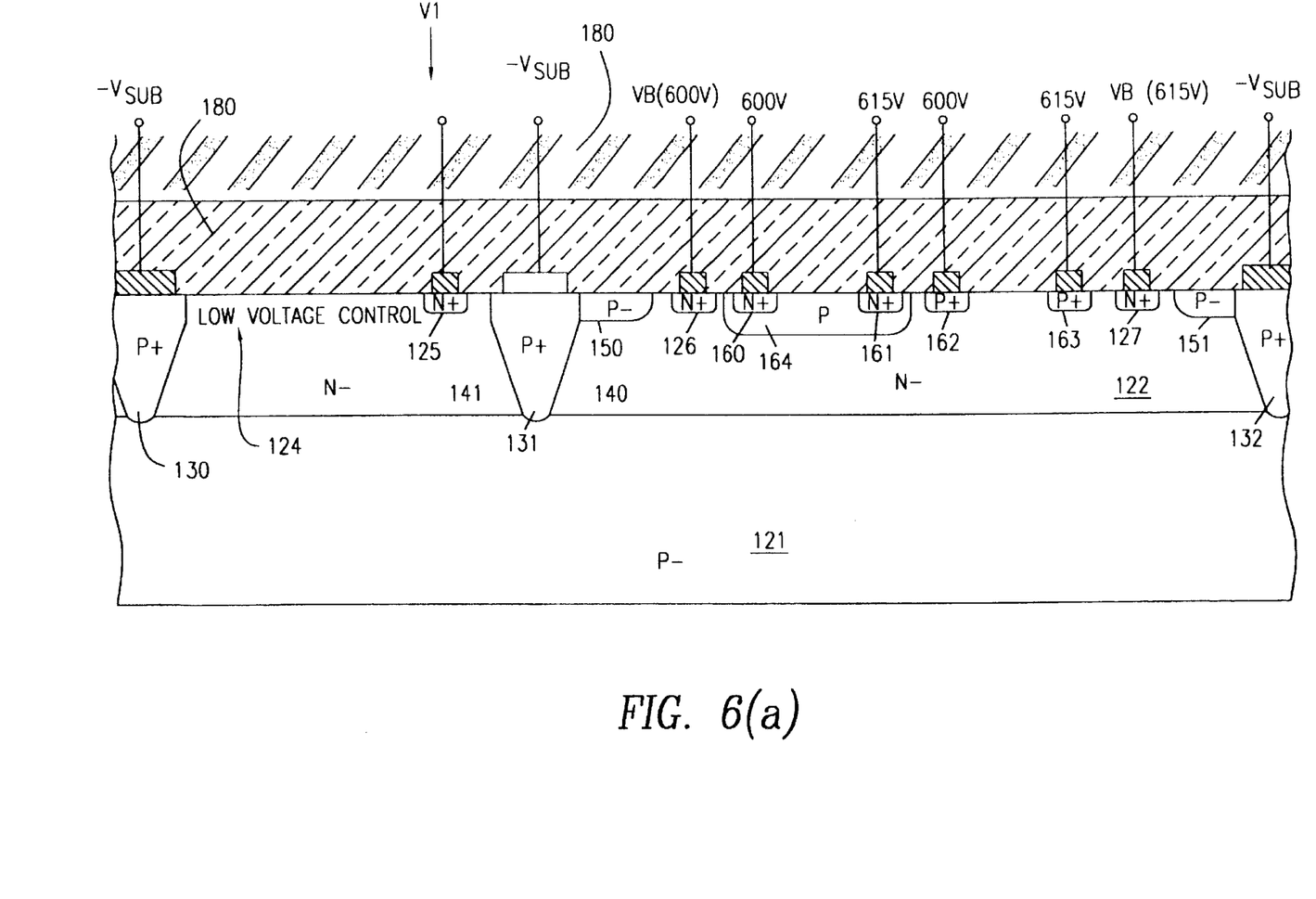
FIG. 6(a) shows how a portion of the circuit of FIG. 3(a) can be implemented in an integrated circuit.
Figure 6B:
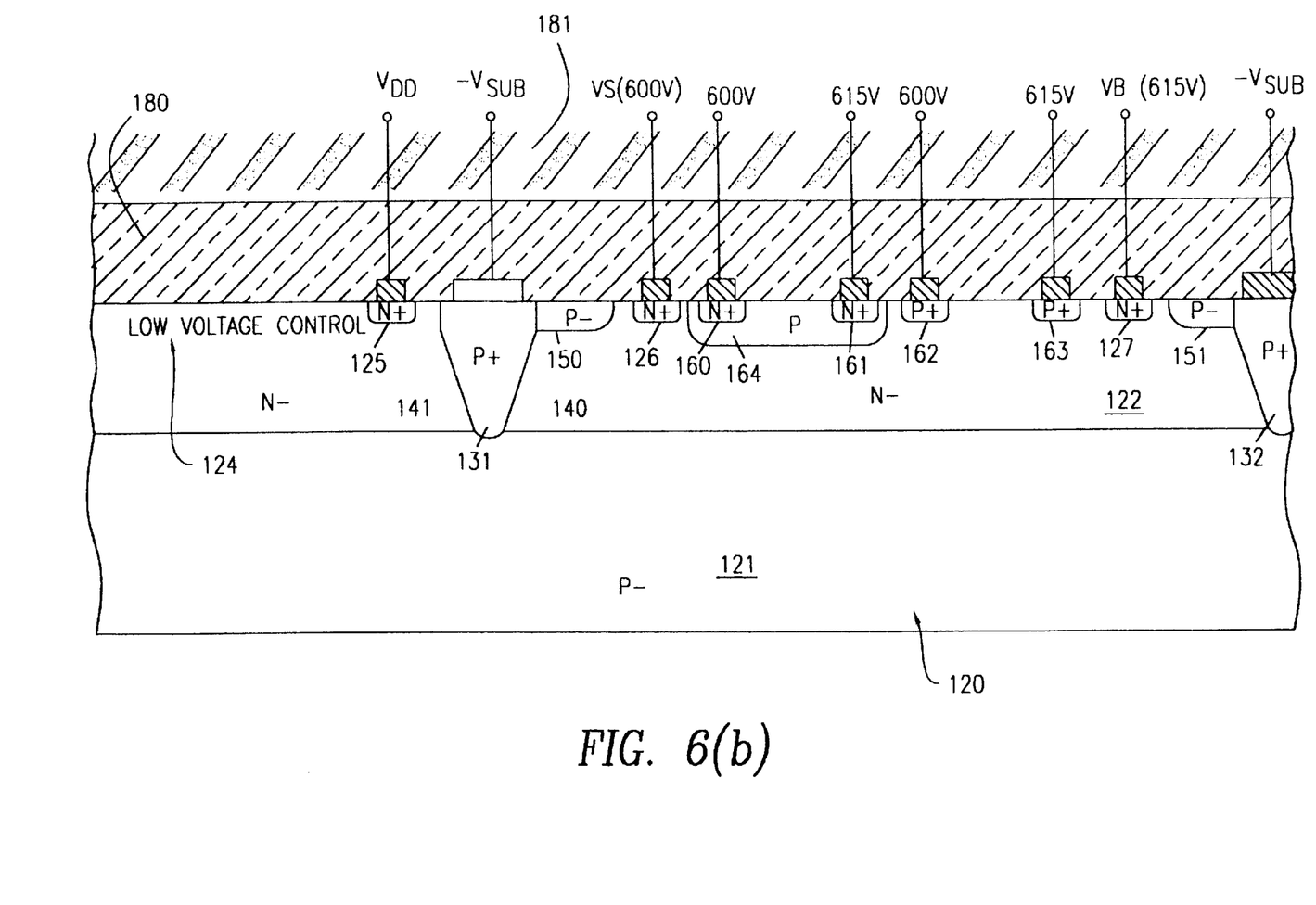
FIG. 6(b) shows how a portion of the circuit of FIG. 3(b) can be implemented in an integrated circuit.

FIGS. 6(a) and 6(b) show how portions of the circuits of respective FIGS. 3(a) and 3(b) can be implemented in an integrated circuit. FIG. 6(a) shows a portion of the circuit of FIG. 3(a) and FIG. 6(b) shows a portion of the circuit FIG. 3(b). The two circuit structures are essentially identical. The only difference is that the various terminals are connected to points of different potential. These are shown in FIGS. 6(a) and 6(b). A description of FIG. 6(a) will now be given. For brevity, a detailed description of FIG. 6(b) will not be given. The reader can observe the differences in potentials by the comparing the two Figures.

When implementing the circuit of FIG. 3(a) in a common chip, the high and low voltage circuits are laterally isolated from one another. FIG. 6(a) shows a portion of such a chip in cross-section. Thus, in FIG. 6(a), a silicon chip 120 consists of a P⁻ substrate 121 which has an epitaxial layer 122 of N⁻ silicon grown thereon. The N⁻ region 122 is separated into high voltage and low voltage regions by P⁺ sinkers 130, 131 and 132. Thus, sinkers 130 and 131 define a high voltage device region 140 in epitaxial layer 122, separated from low voltage region 141. Regions 140 and 141 can have any desired pathology. Moreover, any desired isolation technique can be used between regions 140 and 141.

Typically, MOSFET driver circuits, such as the circuit 24 in FIG. 3(a), comprise P channel and N channel MOSFET transistors. This is described in co-pending patent application Ser. No. 08/660,716, filed Jun. 10, 1996, which is a continuation of Ser. No. 08/274,012, filed Jul. 12, 1994 now abandoned, both, assigned to the assignee of this application. The disclosure of that application is incorporated by reference herein. The high voltage circuitry MOSFETs of the driver circuit 24 of the FIG. 3(a) are shown as formed within high voltage region 140. The P⁺ contact regions 162 and 163, which are diffused in layers 122, represent any of the source and drains of the P channel MOSFETs of the driver device 24. The P region 164 is diffused in layer 122 to form the P-type well region. The N⁺ contact regions 160 and 161, which are diffused in the P-type region 64, represent any of the sources and drains of the N channel MOSFETs of the driver device 24 of FIG. 3(a).

Typically, driver devices like circuit 24 of FIG. 3(a) also have a low voltage portion having N-channel and P-channel MOSFETS. The low voltage control circuitry MOSFETs of the driver circuit 24 of FIG. 3(a) are schematically shown as formed within area 141. N+ contact region 125 is diffused in region 141 and receives an electrode which is at the potential V1. The low voltage control region 124 would also contain diffusions, not shown, identical to the diffusions 160 to 164 in the high voltage region 40 of the low voltage transistors. However, all the N+ and P+ diffusions in the low voltage control region 124 would receive electrodes which are at levels between −$V_{sub}$ and V1. These would represent the sources and drains of the low voltage MOSFETs of the driver circuit 24 of FIG. 3(a).

N+ contact regions 126 and 127 are diffused into layer 122 and receive metallic electrodes which can be at potentials between $V_B$ (615V) and $V_s$(600v). The P+ sinkers 130, 131, and 132 receive electrodes which are at −$V_{sub}$ potential. P(−) resurf regions 150 and 151 may encircle the high voltage region 140 to provide isolation from low voltage region 141.

As is conventional, all devices within the silicon surfaces are overcoated by a dielectric, for example, a low temperature silicon dioxide (silox) layer 180 which may have a thickness of about 1.5 micrometers. Contacts to all surface electrodes penetrate the dielectric layer 180 and are taken to suitable external pins, not shown.

The device of FIG. 6(a) is also conventionally housed in a plastic housing 181 which overlies and contacts the upper surface of the completed chip as schematically shown in FIG. 6(a). Plastics used for the housing may be any suitable insulation material such as those sold under the tradenames Nitto MP-150SG, Nitto MP-180, and Hysol MG15-F.

FIG. 6(a) shows the circuit cross-section for the circuit connected to $V_B$ and $V_s$ in FIG. 3(a). Similar circuit constructions would be made for the circuits coupled to $V_{DD}$-$V_{ss}$ and $V_{cc}$-COM of FIG. 3(a). These circuits would be identical but be separate. The only difference would be that, for the $V_{DD}$-$V_{ss}$ circuit of FIG. 3(a), the point of FIG. 6(a) marked $V_B$ would be connected to $V_{cc}$ or $V_{DD}$, depending on whether the $V_{cc}$-COM or $V_{DD}$-$V_{ss}$ circuit is at issue, and the point marked $V_s$ in FIG. 6(a) would be connected to COM or $V_{ss}$, respectively.

The circuit of FIG. 6(b), which shows the construction of a portion of the circuit of FIG. 3(b) is identical to that of FIG. 6(a), except that region 125 is coupled to $V_{DD}$. Regions 130, 131 and 132 remain connected to −$V_{sub}$. The $V_B$-$V_s$ circuit is shown (driver 24 of FIG. 3(b)) in FIG. 6(b). A similar construction would be made for the $V_{cc}$-COM circuit (driver 26 of FIG. 3(b), but the point of FIG. 6(b) marked $V_B$ would be connected to $V_{cc}$ and the point marked $V_s$ would be coupled to COM.

Thus, there has been disclosed a method and circuit for driving power transistors in a half bridge configuration allowing excessive negative swing of the output node without damage. Preferably, the circuit of the invention can be integrated on a single chip, e.g., a silicon chip. For example, the invention can be integrated in the design of conventional MOSFET driver chips, e.g., the IR2110 device.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method of driving power transistors in a half bridge configuration and allowing for excessive negative swing of an output node located between the transistors in the half bridge configuration, said method comprising the steps of:

arranging first and second power transistors in series in a half bridge configuration between a first voltage and a common ground voltage with said output node being located between the first and second power transistors;

providing a pair of driver circuits, each for driving one of the power transistors, wherein at least a respective one of said driver circuits having at least one intrinsic diode;

providing a second voltage source between said common ground potential and an anode of said intrinsic diode to shift the level of said anode such that said intrinsic diode will not forward bias when negative transients are present at the output node; and level shifting input signals supplied to said respective driver circuit from the level of said second voltage source to the level of said common ground potential.

2. The method recited in claim 1, wherein said second voltage source shifts the level of said anode to a negative potential with respect to the common ground potential.

3. The method recited in claim 1, further comprising the step of level shifting said input signals to the level of said second voltage source prior to level shifting said input signals from the level of said second voltage source to the level of said common ground potential.

4. The method recited in claim 1, further comprising the step of level shifting said input signals supplied to another of said driver circuits from the level of said second voltage source to the level of a third voltage.

5. A circuit for driving power transistors arranged in a half bridge configuration and allowing for excessive negative swing of an output node located between the transistors in the half bridge configuration, the power transistors being connected in series between a first voltage source and a common ground potential, the circuit comprising:

a pair of driver circuits, each for driving one of the power transistors, wherein at least a respective one of said driver circuits having at least one intrinsic diode;

a second voltage source provided between said common ground potential and an anode of said intrinsic diode to shift the level of said anode such that said intrinsic diode will not forward bias when negative transients are present at the output node; and at least one level shift circuit connected to said second voltage source and to said respective driver circuit for level shifting, in combination with said respective driver circuit, input signals supplied to said level shift circuit from the level of said second voltage source to the level of said common ground potential.

6. The circuit recited in claim 5, wherein said second voltage source shifts the level of said anode to a negative potential with respect to the common ground potential.

7. The circuit recited in claim 5, further comprising another level shift circuit for level shifting said input signals to the level of said second voltage source prior to level shifting said input signals from the level of said second voltage source to the level of said common ground potential.

8. The circuit recited in claim 5, further comprising another level shift circuit for level shifting said input signals supplied to another of said driver circuits from the level of said second voltage source to the level of a third voltage.

9. A method of integrating, on a single integrated circuit chip, a circuit for driving power transistors in a half bridge configuration and allowing for excessive negative swing of an output node located between the transistors in the half bridge configuration, said method comprising the steps of:

arranging first and second power transistors in series in a half bridge configuration between a first voltage and a common ground potential with said output node being located between the first and second power transistors;

providing a pair of driver circuits, each for driving one of the power transistors, wherein at least a respective one of said driver circuits having at least one intrinsic diode;

providing a second voltage source between said common ground potential and an anode of said intrinsic diode to shift the level of said anode such that said intrinsic diode will not forward bias when negative transients are present at the output node; and level shifting input signals supplied to said respective driver circuit from the level of said second voltage source to the level of said common ground potential.

10. The method recited in claim 9, wherein said second voltage source shifts the level of said anode to a negative potential with respect to the common ground potential.

11. The method recited in claim 9, further comprising the step of level shifting said input signals to the level of said second voltage source prior to level shifting said input signals from the level of said second voltage source to the level of said common ground potential.

12. The method recited in claim 9, further comprising the step of level shifting said input signals supplied to another of said driver circuits from the level of said second voltage source to the level of a third voltage.

13. A circuit integrated, on a single integrated circuit chip, for driving power transistors arranged in a half bridge configuration and allowing for excessive negative swing of an output node located between the transistors in the half bridge configuration, the power transistors being connected in series between a first voltage source and a common potential, the circuit comprising:

a pair of driver circuits, each for driving one of the power transistors, wherein at least a respective one of said driver circuits having at least one intrinsic diode;

a second voltage source provided between said common ground potential and an anode of said intrinsic diode to shift the level of said anode such that said intrinsic diode will not forward bias when negative transients are present at the output node; and at least one level shift circuit connected to said second voltage source and to said respective driver circuit for level shifting, in combination with said respective driver circuits, input signals supplied to said level shift circuit from the level of said second voltage source to the level of said common ground potential.

14. The circuit recited in claim 13, wherein said second voltage source shifts the level of said anode to a negative potential with respect to the common ground potential.

15. The circuit recited in claim 13, further comprising another level shift circuit for level shifting said input signals to the level of said second voltage source prior to level shifting said input signals from the level of said second voltage source to the level of said common ground potential.

16. The circuit recited in claim 13, further comprising another level shift circuit for level shifting said input signals supplied to another of said driver circuits from the level of said second voltage source to the level of a third voltage.

* * * * *